(12) United States Patent
Kawakita et al.

(10) Patent No.: US 7,203,073 B2
(45) Date of Patent: Apr. 10, 2007

(54) CIRCUIT-CONSTITUTING MEMBER AND CIRCUIT UNIT

(75) Inventors: Shinji Kawakita, Mie (JP); Takahiro Onizuka, Aichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 521 days.

(21) Appl. No.: 10/609,543

(22) Filed: Jul. 1, 2003

(65) Prior Publication Data

US 2004/0001319 A1    Jan. 1, 2004

(30) Foreign Application Priority Data

Jul. 1, 2002    (JP)    ............................. 2002-192237

(51) Int. Cl.
    *H05K 7/06*    (2006.01)
(52) U.S. Cl. .................. 361/775; 361/781; 361/813; 361/819; 361/820; 439/76.2
(58) Field of Classification Search .................. None
    See application file for complete search history.

(56) References Cited

U.S. PATENT DOCUMENTS

| | | | | |
|---|---|---|---|---|
| 3,988,596 A | * | 10/1976 | Minami et al. ............. 327/541 |
| 4,010,433 A | * | 3/1977 | Nishimura et al. ......... 355/129 |
| 5,668,698 A | * | 9/1997 | Jozwiak et al. ............. 361/752 |
| 5,823,798 A | * | 10/1998 | Zintler et al. .............. 439/76.2 |
| 6,252,479 B1 | * | 6/2001 | Kern et al. .................... 335/80 |
| 6,272,734 B1 | * | 8/2001 | Kern .......................... 29/602.1 |
| 6,401,976 B1 | * | 6/2002 | Estelle et al. ................. 222/52 |
| 6,619,967 B2 | | 9/2003 | Murakoshi | |

FOREIGN PATENT DOCUMENTS

| | | |
|---|---|---|
| EP | 1 039 790 A2 | 9/2000 |
| EP | 1 178 584 A2 | 2/2002 |
| JP | A 10-35375 | 2/1998 |

\* cited by examiner

*Primary Examiner*—John B. Vigushin
(74) *Attorney, Agent, or Firm*—Oliff & Berridge, PLC (57) ABSTRACT

A group of bus bars, forming a power circuit, are adhesively bonded to a surface of a control circuit board. Surface-mounting type relay switches are used as a switching unit for the power circuit. Contact-side terminals of each relay switch are mounted on the bus bar group while coil-side terminals thereof are mounted on the control circuit board. The opening and closing of relay contacts are controlled by a control circuit incorporated in the control circuit board.

14 Claims, 5 Drawing Sheets

CIRCUIT-CONSTITUTING MEMBER AND CIRCUIT UNIT

BACKGROUND OF THE INVENTION

1. Field of the Invention

This invention relates to a circuit-constituting member for forming a power circuit in a vehicle such as an automobile.

2. Description of the Related Art

As a conventional unit for distributing electric power to electronic units from a common on-vehicle power source, there has been known an electric connection box in which a plurality of bus bar boards are stacked together to form a power feed circuit, and fuses and relay switches are incorporated thereinto.

In recent years, in order to achieve a compact design and high-speed switching control of such an electric connection box, there has been developed an electric connection box in which instead of using the relays, semiconductor switching devices such as a FET are provided between input and output terminals.

For example, JP-A-10-35375 discloses an electric connection box which includes a bus bar board forming a current circuit, FETs (semiconductor switching devices) incorporated into the current circuit, and a control circuit board for controlling the operation of the FETs. The bus bar board and the control circuit board are arranged at two (upper and lower) stages in spaced relation to each other. The FETs are disposed between the two boards. Drain terminals and source terminals of the FETs are connected to the bus bar board while gate terminals of the FETs are connected to the control circuit board.

In the electric connection box disclosed in the above publication, there are needed at least two boards, that is, the bus bar board and the control circuit board. Besides, there must be secured a space for allowing these boards to be arranged in a three-dimensional manner in spaced relation to each other so that the FETs can be provided between the two boards. Also, in the above electric connection box, the FETs are provided between the bus bar board and the control circuit board. Therefore heat generated from the FETs is liable to remain in the space between the two boards. It is necessary to adopt a complicated structure for radiating this heat. Also, a complicated and large radiating member, having many fins for radiating purposes, must be used.

SUMMARY OF THE INVENTION

Under the above circumstances, it is an object of this invention to provide a power circuit, producing a smaller amount of heat, with a simple and compact construction.

In order to solve the above described problems, a circuit-constituting member includes a plurality of bus bars constituting a power circuit, a switching element disposed in the power circuit, and a control circuit board for controlling open/close of the switching element. The bus bars are bonded to a surface of the control circuit board and arranged on a common plane approximately. The switching element includes a contact-side terminal and a coil-side terminal, which are arranged on another approximately common plane. The contact-side terminal is connected to the bus bars. The coil-side terminal is connected to the control circuit board.

In this construction, the plurality of bus bars forming the power circuit are adhesively bonded to the surface of the control circuit board in such a manner that these bus bars are arranged in a common plane approximately. Also, the surface-mounting type relay switches, each having the contact-side terminals and the coil-side terminals arranged in a common plane, are used as the switching means of this power circuit, and the contact-side terminals are mounted on the bus bars while the coil-side terminals are mounted on the control circuit board. Therefore, as compared with a construction in which many semiconductor switching devices (such as FETs) are used as such switching means, the overall height (thickness) of the circuit-constituting member can be made much smaller while reducing the amount of heat, produced in the whole of the circuit, to a lower level. In addition, basically, it is not necessary to use a bus bar board (in which bus bars are held by an insulating board), required in a conventional electric connection box, and wiring elements, required for connecting the semiconductor switching devices to the boards (However, in the present invention, the use of some wiring elements and FETs or the like is not prevented). Therefore, the overall construction is greatly reduced in thickness and simplified as compared with a conventional construction in which a bus bar board and a control circuit board are provided in spaced relation to each other, and semiconductor switching devices are connected to the two boards.

Preferably, a through hole is formed in the control circuit board, and the contact-side terminal is connected to the bus bars via the through hole. With this construction, the surface-mounting type relay switch can be mounted on both of the control circuit board and the bus bars without any trouble. In addition, height of an end portion of the coil-side terminal is higher than that of an end portion of the contact-side terminal by thickness of the control circuit board. With this construction, the terminals can be mounted respectively on the bus bar group and the control circuit board despite the thickness of the control circuit board without imparting undue deformation to the terminals, and therefore stresses in the thus mounted terminals are greatly reduced.

In the invention, each bus bar may be arranged desirably. Preferably, the plurality of bus bars project from the control circuit board in a side direction to form connection terminals. With this construction, the power circuit, formed by the bus bars, can be easily connected to an external circuit.

Preferably, the power circuit, formed by the bus bars, is a power feed circuit for supplying electric power from a power source to a plurality of electrical loads via the relay switches. In this case, the connection terminals include input terminals for connection to the power source, and a plurality of output terminals for connection to the electrical loads, and the plurality of bus bars feed electric power, supplied to the input terminals, to the electrical loads from the output terminals.

Preferably, the circuit constituent member further includes a fuse terminal and a second bus bar group including other bus bars. The plurality of bus bars constitute a first bus bar group. The output terminals of the first bus bar group are arranged with projections in a common direction to constitute first fuse connection terminals. Second fuse connection terminals are formed at one ends of the second bus bar group and external connection terminals are formed at the other ends thereof. The second bus bar group is arranged so that the second bus bar group is approximately parallel to the control circuit board and that each of second fuse connection terminals faces each of first fuse connection terminals. The fuse terminal is detachably attached to the first and second fuse connection terminals in a straddle manner. With this construction, a plurality of fuse mounting portions can be provided in a concentrated manner at one region in contrast with the case where fuses are mounted on a power circuit formed by bus bars, and besides the fuses can be easily attached and detached, so that the efficiency of a maintenance operation is enhanced.

According to another aspect of the invention, there is provided a circuit unit which includes the above-mentioned circuit-constituting member, and a radiating member having a circuit disposition surface. The bus bars of the circuit-constituting member are fixed to the circuit-mounting surface through an insulating layer.

In this circuit unit, heat, produced in the circuit-constituting member, can be efficiently dissipated to the exterior via the radiating member.

In this case, the surface-mounting type relay switch produces a smaller amount of heat as compared with a semiconductor switching device such as an FET, and therefore the structure of the radiating member can be simplified. For example, the radiating member can have a sheet-like shape, and can have a mounting portion for connection to a vehicle. With this construction, the overall structure of the unit can be simplified, and can be reduced in thickness as compared with a conventional unit employing a radiating member having many fins. And besides, the circuit unit can be easily mounted on the vehicle, utilizing the mounting portion of the radiating member, and heat, generated in the circuit-constituting member, is allowed to efficiently escape to the vehicle through the radiating member.

According to a further aspect of the invention, a switching element includes a main body, a contact-side terminal extending from the main body and connected to a first member, and a coil-side terminal extending from the main body and connected to a second member. The contact-side terminal and the coil-side terminal are arranged on a common plane approximately.

In this relay switch, the contact-side terminal and the coil-side terminal are arranged on the common plane approximately and extend to outside (for example, from the right and left sides) of the main body.

In this relay switch, preferably, height of an end portion of the coil-side terminal is higher than that of an end portion of the contact-side terminal by a predetermined thickness. With this construction, the terminals can be mounted respectively on the bus bar group and the control circuit board despite the thickness of the control circuit board without imparting undue deformation to the terminals, and therefore stresses in the thus mounted terminals are greatly reduced.

DETAILED DESCRIPTION OF THE PREFERRED EMBODIMENTS

A preferred embodiment of the present invention will now be described with reference to the drawings. Here, there will be described a circuit unit forming a power feed circuit for distributing electric power, supplied from a common power source mounted on a vehicle or the like, to a plurality of electrical loads. However, the invention is not limited to such application, but can be extensively applied to cases where the on/off switching of the energization in a power circuit is effected.

Figure 1:
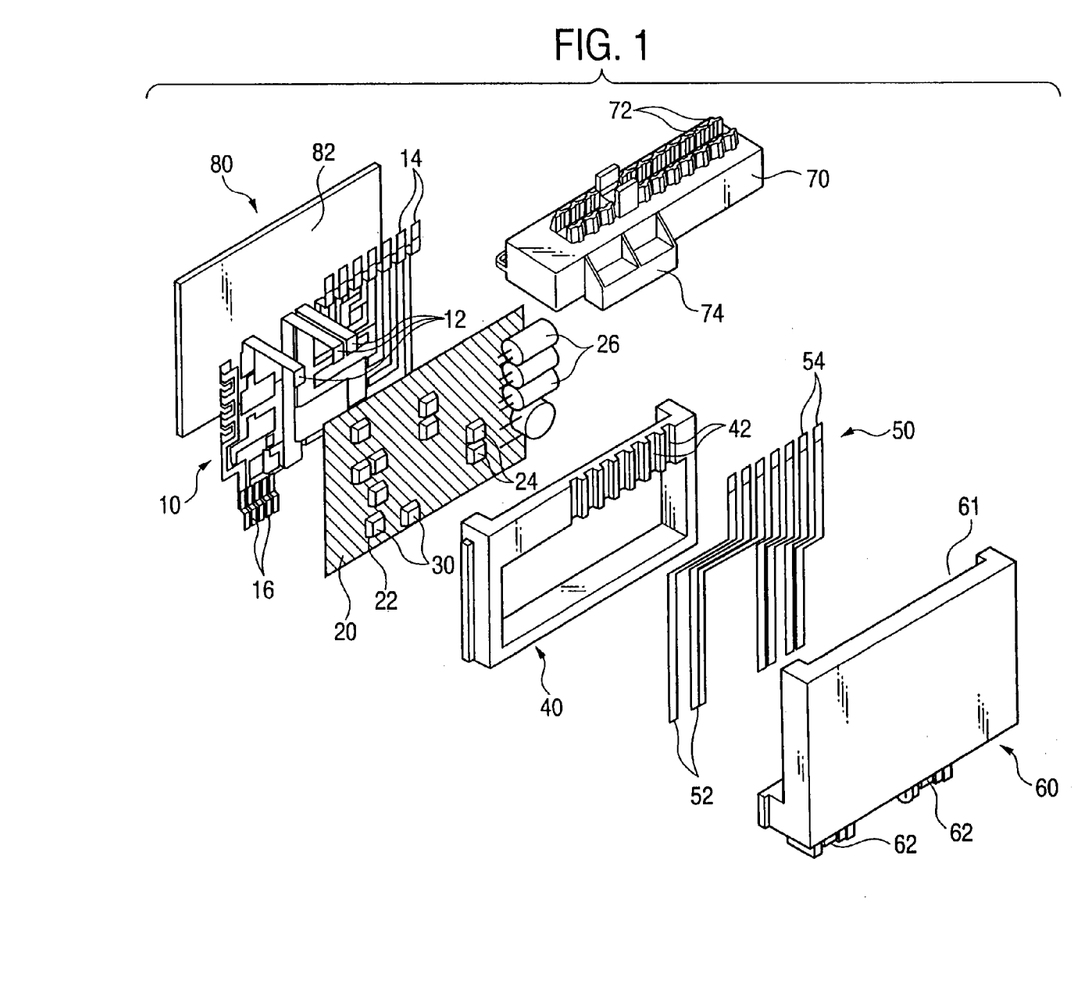
FIG. 1 is an exploded, perspective view of a preferred embodiment of a circuit unit of the present invention.

The circuit unit, shown in FIG. 1, includes a circuit-constituting bus bar group 10 having a number of circuit-constituting bus bars, a control circuit board 20, a plurality of relay switches 30, an intermediate casing 40 made of an insulative material, an external connection bus bar group 50 having a plurality of output bus bars, an outer casing 60 and an upper casing 70 each made of an insulative material, and a radiating member 80. Incidentally, the relay switch 30 may be a semiconductor element such as a FET.

The radiating member 80 is made of a material of good thermal conductivity such as aluminum, and in the illustrated embodiment, this radiating member is formed into a flat plate-like shape. One side (front side in FIG. 1) of this radiating member serves as a flat circuit-mounting surface 82, and this circuit-mounting surface 82 is coated with an insulating layer (not shown). For example, this insulating layer can be formed by coating an insulative adhesive onto the circuit-mounting surface 82 and then drying it, or by bonding a thin insulative film to the circuit-mounting surface 82.

The group 10 of (many) bus bars are arranged on the circuit-mounting surface 82, and are fixed to this surface 82. The bus bar group 10 includes a plurality of input bus bars each having an input terminal 12 formed at one end thereof, a plurality of output bus bars each having a first fuse connection terminal 14 formed at one end thereof, and a plurality of signal bus bars each having a signal terminal 16 formed at one end thereof.

Each of the input terminals 12 has such a shape that it projects long perpendicularly from the circuit-mounting surface 82. The first fuse connection terminals 14 are arranged in parallel to the circuit-mounting surface 82, and project upwardly. Each fuse connection terminal 14 is formed into a bifurcated shape so as to grip a terminal of a fuse element (not shown). The signal terminals 16 are arranged in parallel to the circuit-mounting surface 82, and project downwardly.

In the case where the bus bars include those bus bars which are to be grounded, these bus bars may be fixed to the radiating member 80 by screws and the radiating member 80 may be connected to the ground.

The bonding of the bus bar group 10 to the radiating member 80 may be conducted prior to other steps, or may be conducted at a final step after a circuit-constituting member is assembled as described later.

The control circuit board 20 includes a control circuit for controlling opening/closing of contacts of the relay switches 30 (that is, for controlling the energization of relay coils). This control circuit board 20 can be formed, for example, of an ordinary printed circuit board (in which conductors, forming the control circuit, are arranged on an insulating board by printing). In the illustrated embodiment, the sheet-like control circuit board 20, having a very small thickness (for example, 0.3 mm), is used in order to further enhance the overall thin design. A limited number of FETs 24 and other electronic circuit elements 26 are mounted on the control circuit board 20. A plurality of through holes 22 are formed at suitable portions of this control circuit board 20. These through holes 22 are provided for mounting the relay switches 30 on the bus bars.

Figure 3:
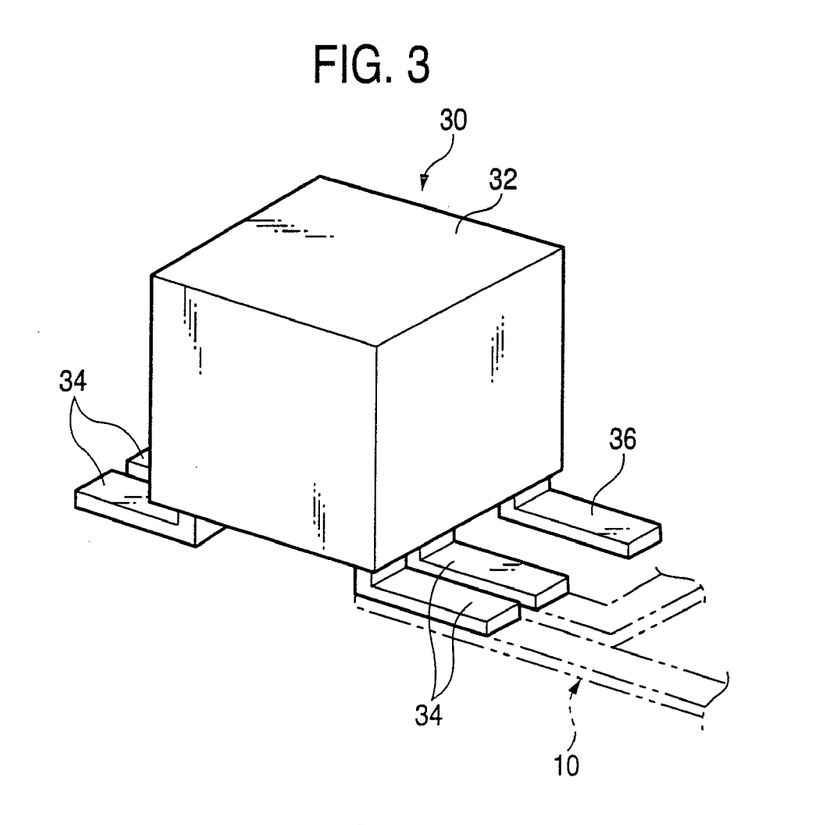
FIG. 3 is a perspective view of a surface-mounting type relay switch used in the circuit unit.
Figure 4:
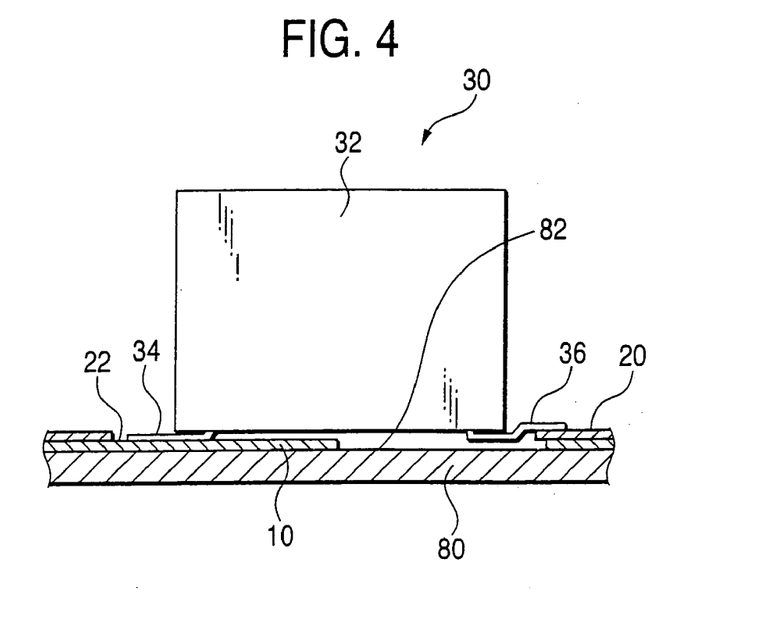
FIG. 4 is a cross-sectional view of the relay switch in its mounted condition.

As shown in FIGS. 3 and 4, the relay switch 30 includes a body 32 of a rectangular parallelepiped shape, and contact-side terminals 34 and coil-side terminals 36 which project from a lower surface of the body 32. This relay switch 30 is of a surface-mounting type relay switch in which the terminals 34 and the terminals 36 extend from the right and left sides of the relay switch body and are arranged in an approximately common plane. The contact-side terminals 34 are connected to the bus bars of the bus bar group 10 through the through holes 22, and the coil-side terminals 36 are connected to the control circuit board 20. With this construction, the relay contacts of the relay switches 30 are disposed in the power circuit formed of the bus bar group 10. Also, the control of the energization of the coils of the relay switches 30 (that is, the control of the opening/closing of the relay contacts) is conducted by the control circuit of the control circuit board 20.

Such a circuit-constituting member can be efficiently produced, for example, by the following method.

Figure 5:
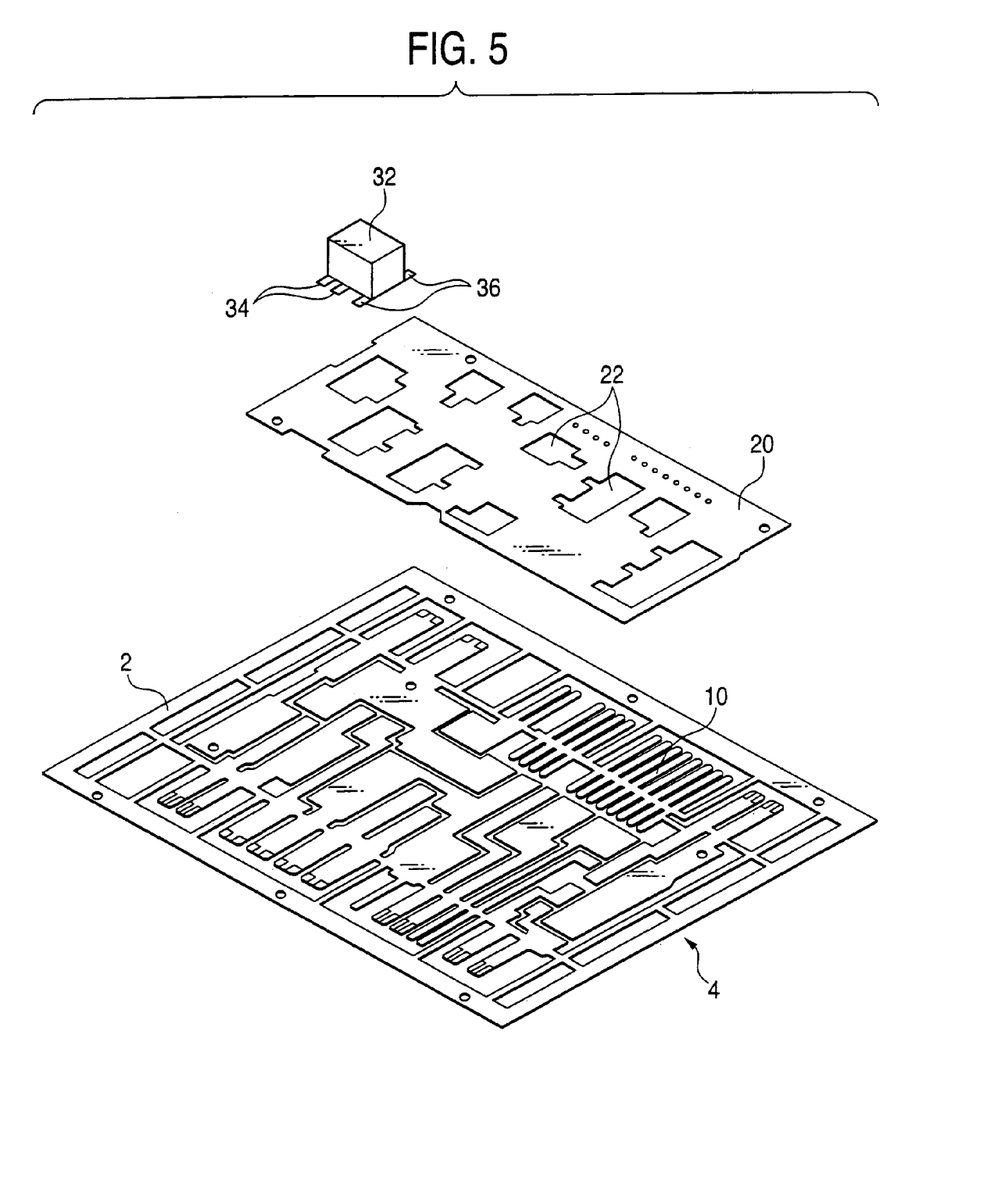
FIG. 5 is a perspective view showing an example of a method of producing the circuit unit.

1) First, there is formed a bus bar-constituting plate 4 (as shown in FIG. 5) including a group 10 of interconnected bus bars provided within an outer frame 2. This bus bar-constituting plate 4 can be formed, for example, by stamping out a single thin metal sheet by a pressing operation.

Figure 2:
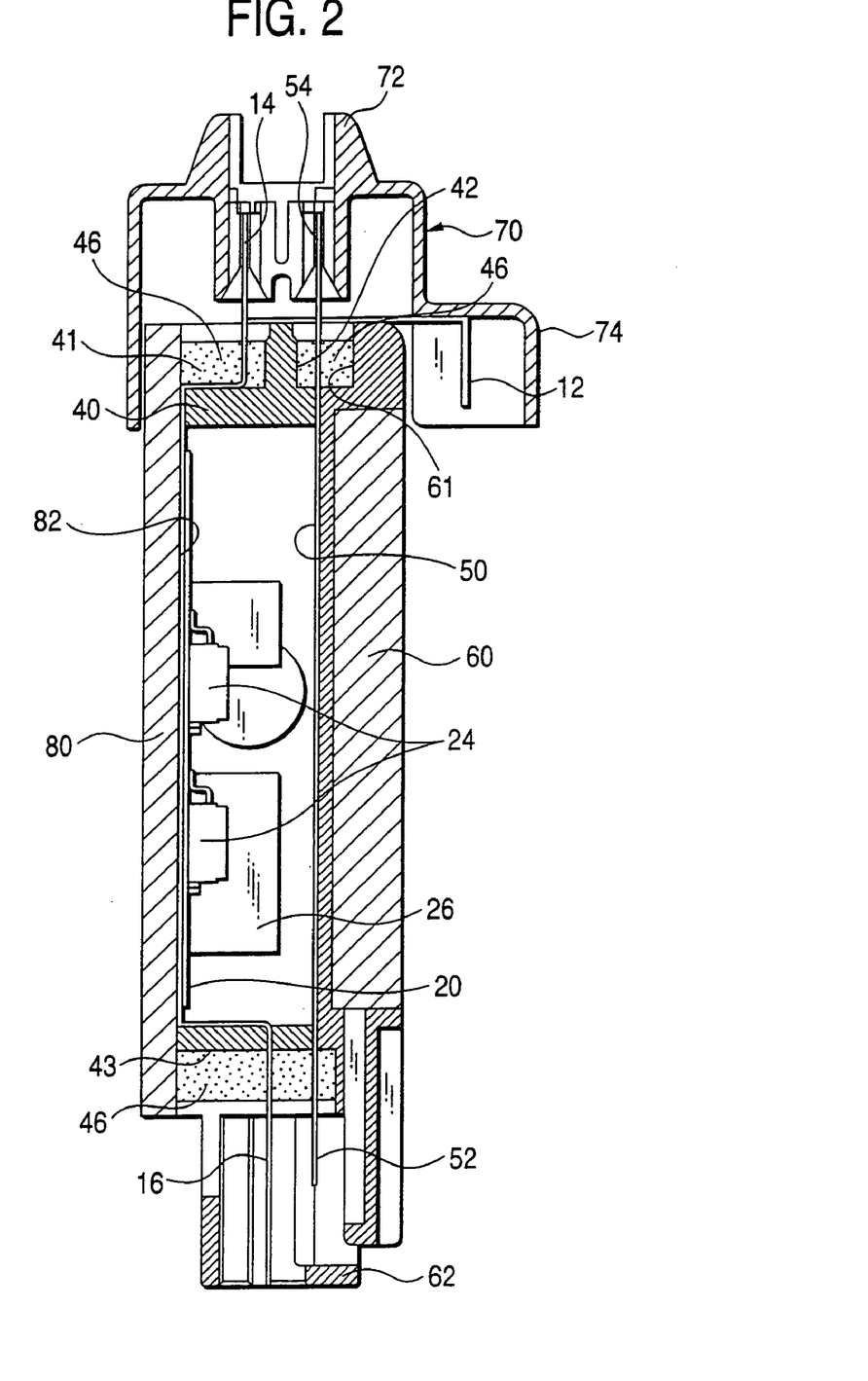
FIG. 2 is a cross-sectional, side-elevational view of the circuit unit.

2) The control circuit board 20, having the through holes 22, is adhesively bonded to one side (upper surface in FIG. 5) of the bus bar-constituting plate 4 as shown in FIG. 2. The outer size of the control circuit board 20 is smaller than the outer size of the bus bar-constituting plate 4. Particularly, the width of this board between its right and left side edges is sufficiently smaller than that of the bus bar-constituting plate 4. After the control circuit board 20 is bonded to the bus bar-constituting plate, portions of the bus bar-constituting plate 4, which project outwardly beyond the peripheral edge of the board 20, are suitably cut off, thereby providing the bus bar group 10 (forming the power circuit) as shown in FIGS. 1 and 2.

Various methods can be used for the above bonding. Examples of such methods will be described below.

EXAMPLE 1

Conductor patterns are formed on both of opposite sides (front and reverse surfaces) of the control circuit board 20, and an adhesive is coated onto the reverse-side (upper side in FIG. 1) pattern or the bus bar-constituting plate 4, and this reverse-side pattern is adhesively bonded to the upper surfaces of the bus bars. In this case, only the pattern, which will be at the same potential as the bus bars, is provided on the reverses side of the control circuit board 20.

EXAMPLE 2

An insulative adhesive is coated onto the reverse side of the control circuit board 20 or the upper surface of the bus bar-constituting plate. An insulating layer is formed between the control circuit board 20 and the bus bars by this adhesive. In the case where the control circuit board 20 includes through holes, it should be taken care that the insulative adhesive is not adhere to these through hole portions.

EXAMPLE 3

An adhesive is coated only onto edge portions of the reverse side of the control circuit board 20. This control circuit board is bonded to the upper surfaces of the bus bars. In this case, the bonding areas are only these edge portions, and the control circuit board 20 and the bus bars are free relative to each other at an area inside the bonding areas. Therefore, stresses are reduced.

3) The relay switches (FET) 30, which are semiconductor switching elements, are connected to both of the control circuit board 20 and the bus bar-constituting plate 4, utilizing the through holes 22 formed in the control circuit board 20. Here, when a distal end portion of the coil-side terminal 36 is stepped upwardly relative to a distal end portion of the contact-side terminal 34 by the thickness of the control circuit board 20, the terminals 34 and 36 can be connected to the bus bar group 10 and the control circuit board 20 regardless of the thickness of the control circuit board 20 without imparting undue deformation to the terminals 34 and 36. Therefore, stresses in the thus mounted terminals are greatly reduced.

This mounting step can be easily carried out, for example, merely by coating molten solder in the through holes 22 by printing or the like, and then putting the relay switch (FET) 30 thereon.

In the case where the bus bars of the bus bar-constituting plate 4 includes bus bars which are to be directly connected to the control circuits on the control circuit board 20, suitable projections may project from these bus bars and be soldered to the control circuit board 20, 4) After the bonding operation, the bus bar end portions, projecting outwardly from the control circuit board 20, are bent to form the terminals 12, 14 and 16 as shown in FIG. 1.

5) Further, the external connection bus bar group 50 is assembled through the intermediate casing 40. The outer casing 60 is attached to cover the outer side of this external connection bus bar group 50.

The intermediate casing 40 is interposed between the control circuit board 20 (and the circuit-constituting bus bar group 10) and the external connection bus bar group 50. The outer casing 60 covers the outer side of the external connection bus bar group 50.

The external connection bus bar group 50 includes a plurality of output bus bars. A lower end portion of each of output bus bars serves as an external connection terminal 52, while a second fuse connection terminal 54, having the same shape (that is, a bifurcated shape) as that of the first fuse connection terminal 14, is formed at an upper end thereof. These output bus bars are supported by the intermediate casing 40 in approximately parallel to the control circuit board 20. The first fuse connection terminals 14 are disposed to face the second fuse connection terminals 54. Fuse terminals of a fuse element (not shown) is detachably connected to the pair of connection terminals 14 and 54 with straddling the connection terminals 14 and 54.

As shown in FIG. 2, a recess 41, which is open toward the radiating member 80, and a recess 42, which is open toward the outer casing 60, are formed in the upper end portion of the intermediate casing 40. Further, a recess 43, which is open toward the radiating member 80, is formed in a lower end portion of the intermediate casing 40. A recess 61, which faces the recesses 42, is formed in a reverse surface of the outer casing 60 at an upper end portion thereof.

The first fuse connection terminals 14 project upwardly from the recess 41. The second fuse connection terminals 54 project upwardly from the recesses 42 and 61. The signal terminals 16 and the external connection terminals 52 project downwardly from the recess 43. A suitable synthetic resin (for example, an epoxy resin) is filled in each of these recesses, thereby forming a waterproof construction of the circuit-constituting member body. Downwardly-open hoods 62 are formed on the lower surface of the outer casing 60. The hoods 62 protect The signal terminals 16 and the external connection terminals 52. Housings of external connectors (not shown) can be fitted to these hoods 62.

The upper casing 70 is attached to cover the upper portions of the radiating member 80 and circuit-constituting member. Fuse mounting portions 72 into which the fuse elements (not shown) can be fitted are formed at a top wall of the upper casing 70. The fuse connection terminals 14 and 54 are arranged at inner portions (lower portions in the drawings) of the fuse mounting portions 72. The fuse terminals of each fuse element (not shown), mounted in the fuse mounting portions 72, are fitted to the fuse connection terminals 14 and 54, and are electrically connected thereto. Therefore, the plurality of fuse elements can be easily attached and removed in one direction in a concentrated manner.

A terminal cover 74 is formed on a side surface of the upper casing 70. This terminal cover 74 covers the input terminals 12 from the upper side.

In the circuit-constituting member produced as described above, the fuse terminals of the fuse elements are connected to the fuse connection terminals 14 and 54. The power source is connected to the input terminals 12. Electrical loads are connected to the external connection terminals 52. Thereby, the power feed circuit for feeding electric power from the input terminals 12 to the electrical loads via the fuse elements is formed. Besides, the control circuits incorporated in the control circuit board 20 control the energization of the relay coils of the relay switches 30 (that is, the opening/closing of the relay contacts), which is disposed in the power feed circuit.

In this circuit unit, the group 10 of circuit-constituting bus bars are adhesively bonded to the surface of the control circuit board 20 in such a manner that these bus bars are arranged in an approximately common plane. Besides, the surface-mounting type relay switches 30 are used as the switching device. The contact-side terminals 34 of the relay switches 30 are connected to the bus bar group 10 while the coil-side terminals 36 thereof are connected to the control circuit board 20. Therefore, as compared with a circuit unit in which many semiconductor switching devices (such as FETs) are used as switching devices (in the embodiment of the invention, a small number of semiconductor switching devices are used), the overall height (thickness) of the circuit-constituting member can be made much smaller while reducing the amount of heat, produced in the whole of the circuit, to a lower level. In addition, basically, it is not necessary to use a bus bar board (in which bus bars are held by an insulating board), required for a conventional electric connection box, and wiring elements required for connecting the semiconductor switching devices to the boards.

Since the amount of generated heat is relatively small as described above, for example, a thin flat sheet-like member as shown in the drawings can be used as the radiating member 80. Thereby, the overall structure of the circuit unit can be formed into the simple and compact design.

Figure 6:
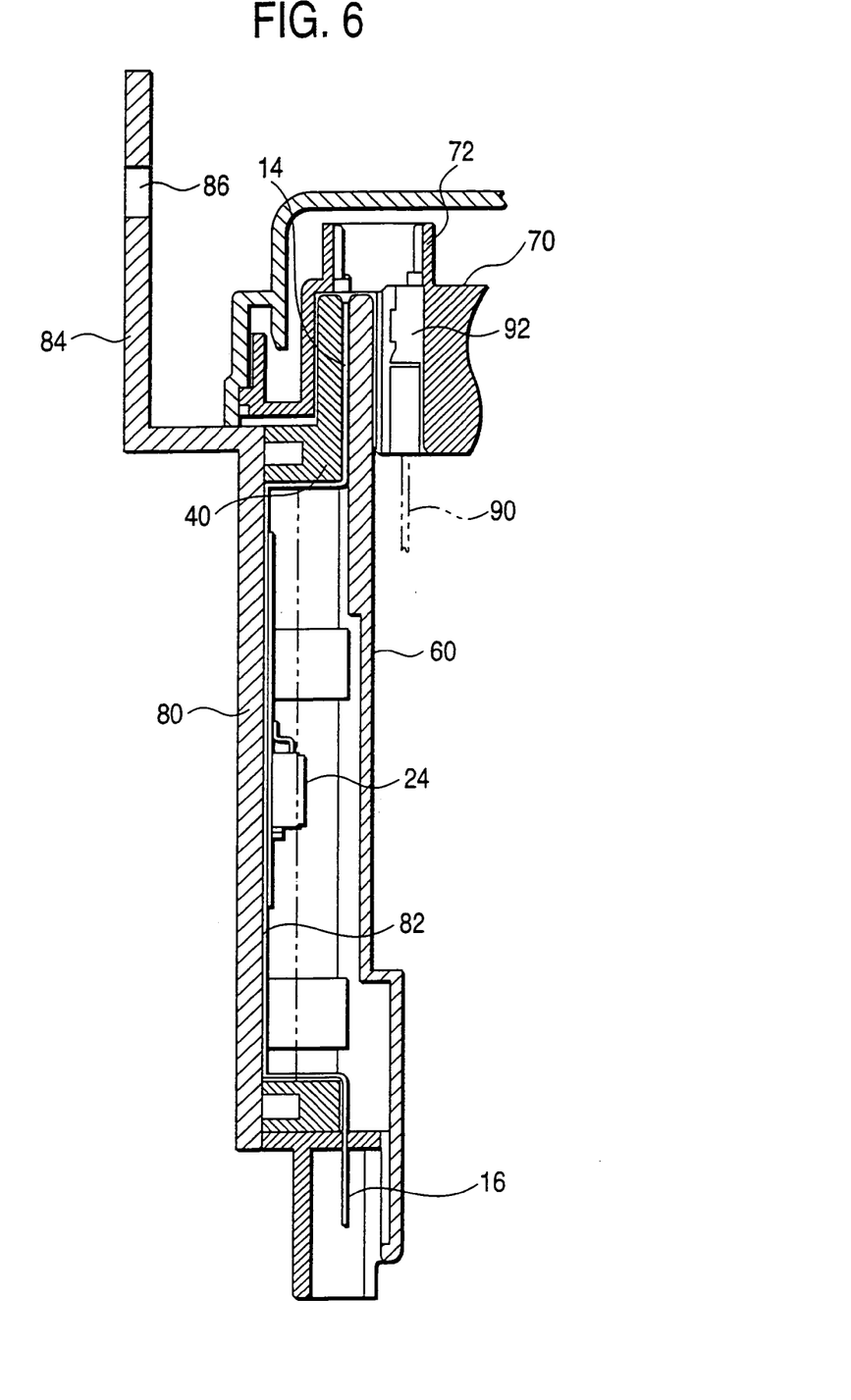
FIG. 6 is a cross-sectional, front-elevational view showing another embodiment of a circuit unit of the invention.

As shown in FIG. 6, a mounting portion 84 may extend from a radiating member 80 and a bolt through hole 86 may be formed in the mounting portion 84 so that it is made to attach the radiating member 80s directly to a vehicle side member (for example, a body). With this construction, heat, produced in the circuit-constituting member, is allowed to efficiently escape to the vehicle through the radiating member.

In the embodiment shown in FIG. 6, the provision of the external connection bus bars 50 and outer casing 60, shown in FIG. 2, is omitted. Besides, fuse connection terminals 92, connected to end portions of wires 90 extending from external circuits, are mounted in an upper casing 70. Each fuse element is attached in a bridging manner to the corresponding fuse connection terminal 92 and first fuse connection terminal 14.

As described above, in the present invention, the plurality of bus bars, forming the power circuit, are bonded to the surface of the control circuit board, and the surface-mounting type relay switches are used as the switching means for the power circuit, and the contact-side terminals of the relay switch are mounted respectively on the corresponding bus bars, while the coil-side terminals thereof are mounted on the control circuit board. Therefore, there is achieved an advantage that the power circuit which produces a smaller amount of heat can be built with the simple and compact construction.

What is claimed is:

1. A circuit-constituting member comprising:
   a plurality of bus bars constituting a power circuit;
   a switching element disposed in the power circuit; and
   a control circuit board for controlling open/close of the switching element, wherein:
   the bus bars are bonded to a surface of the control circuit board and arranged on an approximately common plane;
   the switching element includes a contact-side terminal and a coil-side terminal, which are arranged on another approximately common plane;
   the contact-side terminal is connected to the bus bars; and
   the coil-side terminal is electrically and mechanically connected to the control circuit board.

2. The circuit-constituting member according to claim 1, wherein the switching element is a relay switch.

3. The circuit-constituting member according to claim 1, wherein the switching element is a semiconductor switching element.

4. The circuit-constituting member according to claim 1, wherein:
   a through hole is formed in the control circuit board; and
   the contact-side terminal is connected to the bus bars via the through hole.

5. The circuit constituting member according to claim 4, wherein height of an end portion of the coil-side terminal is higher than that of an end portion of the contact-side terminal by thickness of the control circuit board.

6. The constituting member according to claim 1, wherein the plurality of bus bars project from the control circuit board in a side direction to form connection terminals.

7. The constituting member according to claim 1, wherein:
   each of bus bars include:
   an input terminal connected to a power source side; and
   an output terminal connected to a electric load;
   the plurality of bus bars constitute a power feed circuit, which outputs power supplied from the input terminals to the electric loads through the output terminals.

8. The circuit-constituent element according to claim 7, further comprising:
   a fuse terminal; and
   a second bus bar group including other bus bars, wherein:
   the plurality of bus bars constitute a first bus bar group;
   the output terminals of the first bus bar group are arranged with projections in a common direction to constitute first fuse connection terminals;

second fuse connection terminals are formed at one ends of the second bus bar group and external connection terminals are formed at the other ends thereof;

the second bus bar group is arranged so that the second bus bar group is approximately parallel to the control circuit board and that each of second fuse connection terminals faces each of first fuse connection terminals; and the fuse terminal is detachably attached to the first and second fuse connection terminals in a straddle manner.

9. A circuit unit comprising:

a plurality of bus bars constituting a power circuit;

a switching element disposed in the power circuit;

a control circuit board for controlling open/close of the switching element; and a radiating member having a circuit disposition surface, wherein:

the bus bars are bonded to a surface of the control circuit board with the bus bars arranged on an approximately common plane;

the switching element includes a contact-side terminal and a coil-side terminal, which are arranged on another approximately common plane;

the contact-side terminal is connected to the bus bars;

the coil-side terminal is connected to the control circuit board; and at least a part of the bus bars is fixed to the circuit disposition surface through an insulation layer.

10. The circuit unit according to claim 9, wherein the switching element is a relay switch.

11. The circuit unit according to claim 9, wherein the switching element is a semiconductor switching element.

12. The circuit unit according to claim 9, wherein the radiating member has a plate shape and includes an attachment section coupled to a vehicle side.

13. A switching element, comprising:

a main body;

a contact-side terminal extending from the main body and connected to a first member; and a coil-side terminal extending from the main body and connected to a second member, wherein:

the contact-side terminal and the coil-side terminal are arranged on an approximately common plane; and height of an end portion of the coil-side terminal is higher than that of an end portion of the contact-side terminal by a predetermined thickness.

14. A switching element, comprising:

a main body;

a contact-side terminal extending from the main body and connected to a first member; and a coil-side terminal extending from the main body and electrically and mechanically connected to a second member, wherein:

the contact-side terminal and the coil-side terminal are arranged on an approximately common plane;

the first member is one of bus bars of a circuit constituent member;

the second member is a control circuit board; and the bus bars are arranged on an approximately common plane and are bonded to a surface of the control circuit board.

* * * * *